US008809128B2

(12) United States Patent
Scheuerlein et al.

(10) Patent No.: US 8,809,128 B2
(45) Date of Patent: Aug. 19, 2014

(54) METHODS AND APPARATUS FOR LAYOUT OF THREE DIMENSIONAL MATRIX ARRAY MEMORY FOR REDUCED COST PATTERNING

(75) Inventors: Roy E. Scheuerlein, Cupertino, CA (US); Christopher J. Petti, Mountain View, CA (US); Yoichiro Tanaka, Nagoyashi Aichi (JP)

(73) Assignee: SanDisk 3D LLC, Milpitas, CA (US)

( * ) Notice: Subject to any disclaimer, the term of this patent is extended or adjusted under 35 U.S.C. 154(b) by 686 days.

(21) Appl. No.: 12/911,900

(22) Filed: Oct. 26, 2010

(65) Prior Publication Data

US 2011/0095438 A1     Apr. 28, 2011

Related U.S. Application Data

(60) Provisional application No. 61/255,080, filed on Oct. 26, 2009, provisional application No. 61/255,085, filed on Oct. 26, 2009.

(51) Int. Cl.
*H01L 21/82* (2006.01)
*H01L 27/24* (2006.01)

(52) U.S. Cl.
CPC ......... *H01L 27/2481* (2013.01); *Y10S 257/909* (2013.01)
USPC .......................................... 438/129; 257/909

(58) Field of Classification Search
CPC ............ H01L 27/118; H01L 27/11504; H01L 27/11514; H01L 27/1052; H01L 27/112; H01L 27/115; H01L 27/108; H01L 27/2481; H01L 27/2463; H01L 27/11578; H01L 27/11551; H01L 21/8221
USPC ......... 257/211, 306, 311, 202, 208, 203, 300, 257/296, 302, 390, 382, 903, 905, 906, 908, 257/909; 365/174, 177; 438/FOR. 212, 438/FOR. 189, 244, 637, 128, 129, 130, 438/278, 290, 275, 238, 239, 386, 399, 250, 438/393, 242, 272, 270, 257, 259, 589, 586, 438/587
See application file for complete search history.

(56) References Cited

U.S. PATENT DOCUMENTS 5,915,167 A     6/1999  Leedy
5,977,638 A    11/1999  Rodgers et al.
(Continued)

FOREIGN PATENT DOCUMENTS

WO    WO 2008/008630    1/2008
WO    WO 2009/101878    8/2009

OTHER PUBLICATIONS

U.S. Appl. No. 12/911,887, filed Oct. 26, 2010.
(Continued)

*Primary Examiner* — Thanh Y Tran
(74) *Attorney, Agent, or Firm* — Dugan & Dugan, PC (57) ABSTRACT

The present invention provides apparatus, methods, and systems for a memory layer layout for a three-dimensional memory. The memory layer includes a plurality of memory array blocks; a plurality of memory lines coupled to the memory array blocks; and a plurality of zia contact areas for coupling the memory layer to other memory layers in a three-dimensional memory. The memory lines extend from the memory array blocks and are formed using a sidewall defined process. The memory lines have a half pitch dimension smaller than the nominal minimum feature size capability of a lithography tool used in forming the memory lines. The zia contact areas have a dimension that is approximately four times the half pitch dimension of the memory lines. The memory lines are arranged in a pattern adapted to allow a single memory line to intersect a single zia contact area and to provide area between other memory lines for other zia contact areas. Numerous additional aspects are disclosed.

28 Claims, 7 Drawing Sheets

(56) References Cited

U.S. PATENT DOCUMENTS

| | | |
|---|---|---|
| 6,952,030 B2 | 10/2005 | Herner et al. |
| 7,405,465 B2 | 7/2008 | Herner |
| 7,767,499 B2 | 8/2010 | Herner |
| 2004/0235309 A1 | 11/2004 | Hsu |
| 2005/0127519 A1 | 6/2005 | Scheuerlein et al. |
| 2005/0179134 A1 | 8/2005 | Matsubara |
| 2005/0245008 A1 | 11/2005 | Doris et al. |
| 2006/0154463 A1 | 7/2006 | Furukawa et al. |
| 2006/0250836 A1 | 11/2006 | Herner et al. |
| 2006/0263699 A1 | 11/2006 | Abatchev et al. |
| 2007/0049011 A1 | 3/2007 | Tran |
| 2007/0138535 A1 | 6/2007 | Higashitani |
| 2007/0205443 A1 | 9/2007 | Juengling |
| 2007/0215874 A1 | 9/2007 | Furukawa et al. |
| 2007/0228498 A1 | 10/2007 | Toba et al. |
| 2008/0017996 A1 | 1/2008 | Sato et al. |
| 2008/0171406 A1 | 7/2008 | Orimoto et al. |
| 2008/0318381 A1 | 12/2008 | Matamis et al. |
| 2009/0075485 A1 | 3/2009 | Ban et al. |
| 2009/0087990 A1 | 4/2009 | Yatsuda et al. |
| 2009/0166682 A1 | 7/2009 | Scheuerlein |
| 2009/0168480 A1 | 7/2009 | Scheuerlein et al. |
| 2009/0200583 A1 | 8/2009 | Marokkey et al. |
| 2009/0202952 A1 | 8/2009 | Abraham et al. |
| 2009/0263749 A1 | 10/2009 | Sim et al. |
| 2009/0302472 A1* | 12/2009 | Yoon et al. .................... 257/751 |

OTHER PUBLICATIONS

U.S. Appl. No. 12/911,944, filed Oct. 26, 2010.
International Search Report and Written Opinion of related International Application No. PCT/US2010/054013 dated Oct. 17, 2011.

* cited by examiner

METHODS AND APPARATUS FOR LAYOUT OF THREE DIMENSIONAL MATRIX ARRAY MEMORY FOR REDUCED COST PATTERNING

CROSS-REFERENCE TO RELATED APPLICATIONS

The present application claims priority to U.S. Provisional Patent Application No. 61/255,080, filed Oct. 26, 2009, entitled "DOUBLE SIDEWALL PATTERNING FOR 4× HALF PITCH RELIEF PATTERNING," which is hereby incorporated by reference in its entirety for all purposes. The present application also claims priority to U.S. Provisional Patent Application No. 61/255,085, filed Oct. 26, 2009, entitled "LAYOUT OF 3D MATRIX ARRAY MEMORY FOR REDUCED COST PATTERNING," which is hereby incorporated by reference in its entirety for all purposes.

The present application is also related to U.S. patent application Ser. No. 12/911,887, filed on Oct. 26, 2010, and titled "APPARATUS AND METHODS OF FORMING MEMORY LINES AND STRUCTURES USING DOUBLE SIDEWALL PATTERNING FOR FOUR TIMES HALF PITCH RELIEF PATTERNING" ("the '887 application"), which is incorporated by reference herein in its entirety for all purposes.

The present application is also related to U.S. patent application Ser. No. 12/911,944, filed on Oct. 26, 2010, and titled "METHODS OF FORMING PILLARS FOR MEMORY CELLS USING SEQUENTIAL SIDEWALL PATTERNING" ("the '944 application"), which is incorporated by reference herein in its entirety for all purposes.

FIELD OF THE INVENTION

The present invention relates to memory arrays, and more particularly to methods and apparatus for laying out three dimensional matrix array memory for reducing the cost of patterning.

BACKGROUND

The fabrication of a memory device typically requires a number of steps including lithography, deposition of various constituent materials, patterning, etching, etc. However, the continual reduction in the size of individual memory elements, and the continual increase in the density with which such memory elements are fabricated on memory devices, are challenging the limits of current lithography and patterning technology. For example, presently existing lithography and patterning technology is typically not well suited for forming features having a pitch less than about 32 nanometers. Accordingly, improved methods of patterning memory cells for use in memory devices are desirable. In particular, methods for forming memory elements having small pitch are desirable.

In previous 3D memory arrays, individual memory lines have been interleaved from drivers on two sides of the array. This provides a pitch relief of two to one at the edge of the array. Pitch doubling techniques are desirable for increasing the density of the array lines but a method is needed to interleave these lines in a manner that provides pitch relief in the support connection layout. With half pitch memory lines, using pitch double techniques shrinking to less than the minimum feature size of the lithography tools, more than 2 to 1 pitch relaxation may be required for connecting support circuits to these dense memory arrays. The size of the support circuit connections (e.g., zias) may not shrink as rapidly and may not benefit from pitch doubling techniques. Accordingly, improved methods of relaxing the pitch requirements for support circuit connections are desirable.

SUMMARY

In some embodiments, the present invention provides a method for laying out memory lines. The method includes forming a plurality of memory lines extending from one or more memory array blocks wherein the memory lines have a half pitch dimension smaller than the nominal minimum feature size capability of a lithography tool used in forming the memory lines and forming a plurality of zia contact areas having a dimension larger than the nominal minimum feature size capability of the lithography tool. The memory lines are arranged in a pattern adapted to allow a single memory line to intersect a single zia contact area and to provide area between other memory lines for other zia contact areas.

In other embodiments, the present invention provides a three-dimensional memory. The memory includes a plurality of memory layers coupled together by a plurality of zias, each zia including a zia contact area on at least one memory layer. Each memory layer includes one or more memory array blocks coupled to memory lines. The memory lines extend from the memory array blocks. The memory lines have a half pitch dimension smaller than the nominal minimum feature size capability of a lithography tool used in forming the memory lines. The zia contact areas have a dimension larger than the nominal minimum feature size capability of the lithography tool. The memory lines are arranged in a pattern adapted to allow a single memory line to intersect a single zia contact area and to provide area between other memory lines for other zia contact areas.

In yet other embodiments, the present invention provides a memory layer for a three-dimensional memory. The memory layer includes one or more memory array blocks; a plurality of memory lines coupled to the memory array blocks; and a plurality of zia contact areas for coupling the memory layer to other memory layers in a three-dimensional memory. The memory lines extend from the memory array blocks. The memory lines have a half pitch dimension smaller than the nominal minimum feature size capability of a lithography tool used in forming the memory lines. The zia contact areas have a dimension larger than the nominal minimum feature size capability of the lithography tool. The memory lines are arranged in a pattern adapted to allow a single memory line to intersect a single zia contact area and to provide area between other memory lines for other zia contact areas.

In still other embodiments, the present invention provides a memory layer for a three-dimensional memory. The memory layer includes a plurality of memory array blocks; a plurality of memory lines coupled to the memory array blocks; and a plurality of zia contact areas for coupling the memory layer to other memory layers in a three-dimensional memory. The memory lines extend from the memory array blocks and are formed using a sidewall defined process. The memory lines have a half pitch dimension smaller than the nominal minimum feature size capability of a lithography tool used in forming the memory lines. The zia contact areas have a dimension that is approximately four times the half pitch dimension of the memory lines. The memory lines are arranged in a pattern adapted to allow a single memory line to intersect a single zia contact area and to provide area between other memory lines for other zia contact areas.

In still other embodiments, memory lines may extend out from an edge of the memory array in first groups of adjacent lines (i.e., a first set of multiple groups of two or more lines) interleaved with second groups of adjacent lines (i.e., a second set of multiple groups of two or more lines) that terminate at the edge of the array. The groups of array lines extend out from the array to a contact area including multiple rows of zias. There may be a plurality of zias greater than or equal in number to the plurality of groups of array lines. In some embodiments, the plurality of the array line groups may preferably be an even number.

In still yet other embodiments, a three-dimensional memory array according to the present invention includes a memory array layer including an array and a plurality of memory lines wherein portions of the memory lines extend from the array substantially parallel to each other. A first subset of the memory lines extend from a first side of the array. A second subset of the memory lines extend from a second side of the array. Within the first subset of memory lines, a first plurality of memory lines terminate proximate an edge of the array. Within the first subset of memory lines, a second plurality of memory lines extend beyond the edge of the array into a contact region. The contact region includes a plurality of contacts adapted to couple the second plurality of memory lines to support circuitry. The contacts are disposed in two or more rows. The contact rows are disposed substantially non-parallel to the memory lines and adjacent memory lines couple to contacts in different rows. Numerous additional embodiments are described below with respect to the following drawings.

BRIEF DESCRIPTION OF THE DRAWINGS

Features of the present invention can be more clearly understood from the following detailed description considered in conjunction with the following drawings, in which the same reference numerals denote the same elements throughout.

DETAILED DESCRIPTION

The present invention provides a reduced cost layout pattern for memory lines leading out of and into memory array blocks. The inventive memory line layout accommodates the small pitch that may be achieved in the memory array blocks using a sidewall-defined process to construct the memory arrays. The sidewall-defined process is described in detail in the previously incorporated '887 application.

According to the present invention, X and Y memory lines (e.g., bit and word lines) are interleaved in pairs extending from opposite sides of the memory array blocks with cut shapes on alternating pairs. This arrangement allows the memory line pairs to be spaced apart from other pairs outside of the memory array block and at the same time allows the lines to be staggered so that cut shapes and via (or zia) contact pads can be made larger (e.g., with lest strict tolerances). Thus, the present invention allows the cut shapes disposed between adjacent pairs of memory lines and the contact pads to be, for example, four times the half-pitch dimension of the memory lines.

Further, the present invention facilitates manufacturing cost reduction of submicron three dimensional memory arrays. In particular, the present invention provides methods that avoid having to use extreme-ultraviolet lithography (EUVL) or e-beam direct write lithography methods (e.g., both of which are relatively expensive) to form memory lines with a half-pitch dimension below approximately 32 nm. Thus, using the methods of the present invention, cost efficient 64 nm lithography tools (e.g., lithography tools for forming memory lines and tools for forming cut masks and zias with a nominal minimum feature size of 64 nm) can be used to achieve effective memory line patterning down to a 16 nm half pitch dimension, for example, with array line groups of four and four rows of zias. In some embodiments, 32 nm lithography can be used to achieve effective memory line patterning down to an 8 nm half pitch dimension and 64 nm lithography tools can be used to form cut masks and zias with array line groups of eight and eight rows of zias, for example. Note that in terms of current technology, this improvement represents an extension of 32 nm lithography of five generations: from 32 nm, to 22 nm, to 16 nm, to 11 nm, to 8 nm for array lines and represents an extension of 64 nm lithography of six generations for cut masks and zias.

In other embodiments of the invention, EUV lithography, for example, can be used to achieve effective memory line patterning down to 6 nm half pitch dimension and 60 nm lithography can be used to form cut masks and zias with array line groups of ten and ten rows of zias. However, it will be understood that the present invention may be used to extend other and future technologies as well.

More generally, the present invention facilitates the use of memory lines that have a half pitch dimension smaller than the nominal minimum feature size capability of a lithography tool used to form the memory array lines. According to the present invention, the zia contact areas and cut shapes can have a dimension larger than the nominal minimum feature size capability of the lithography tool used to form the array lines. Zia definition is more difficult than uniform line and space definition. Also, pitch doubling techniques used to further reduce array line pitch may be avoided for the zia processing. As the array line pitch is reduced by using pitch doubling techniques and more expensive process and lithography techniques, the use of simpler and less expensive lithography techniques for zias is advantageous.

Figure 1:
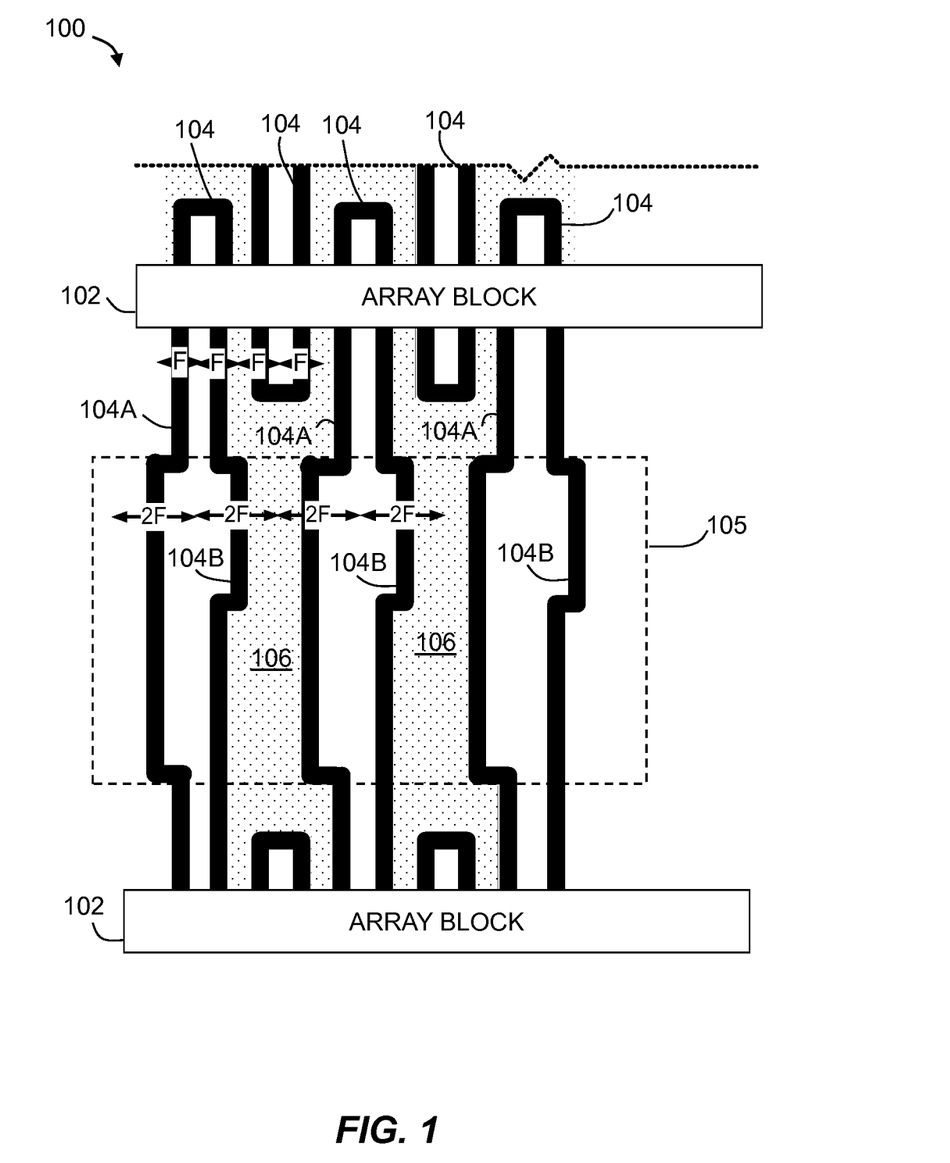
FIG. 1 is a schematic drawing of an example arrangement of a memory line layout according to some embodiments of the present invention.

Turning to FIG. 1, a layout 100 of a three-dimensional memory array is shown. The memory array 100 includes one or more array blocks 102 that include an array of memory cells. Memory array lines 104 extend in pairs in alternating directions from two or more sides of the array blocks 102. A multiple line pitch relaxing layout 100 is achieved by a novel array line layout. The pitch of cut mask shapes (discussed below) is quartered by forming pairs of array lines 104 alternating between extending into a zia contact area 105 versus terminating at the array block 102 edge. The pitch of zia shapes is also quartered because half the array lines are terminated and zias may be arranged in two rows as will be shown in FIG. 2, for example. The tight space between the members of the pairs of array lines 104 extending to the zia contact area 105 is relaxed by adjusting the width and space of the template shape 106 in the zia contact area 105 to provide more than twice the area to place a zia (not shown but see FIG. 2) and four times as large a pitch of zia shapes compared to the array line pitch. Although pairs of lines 104 extending from the array block 102 have no immediate pitch relaxation at the edge of the array 102, a pitch doubling technique, for example a sidewall definition process using a template layer, may be used to extend pairs of lines 104 at the tight half pitch.

Figure 2:
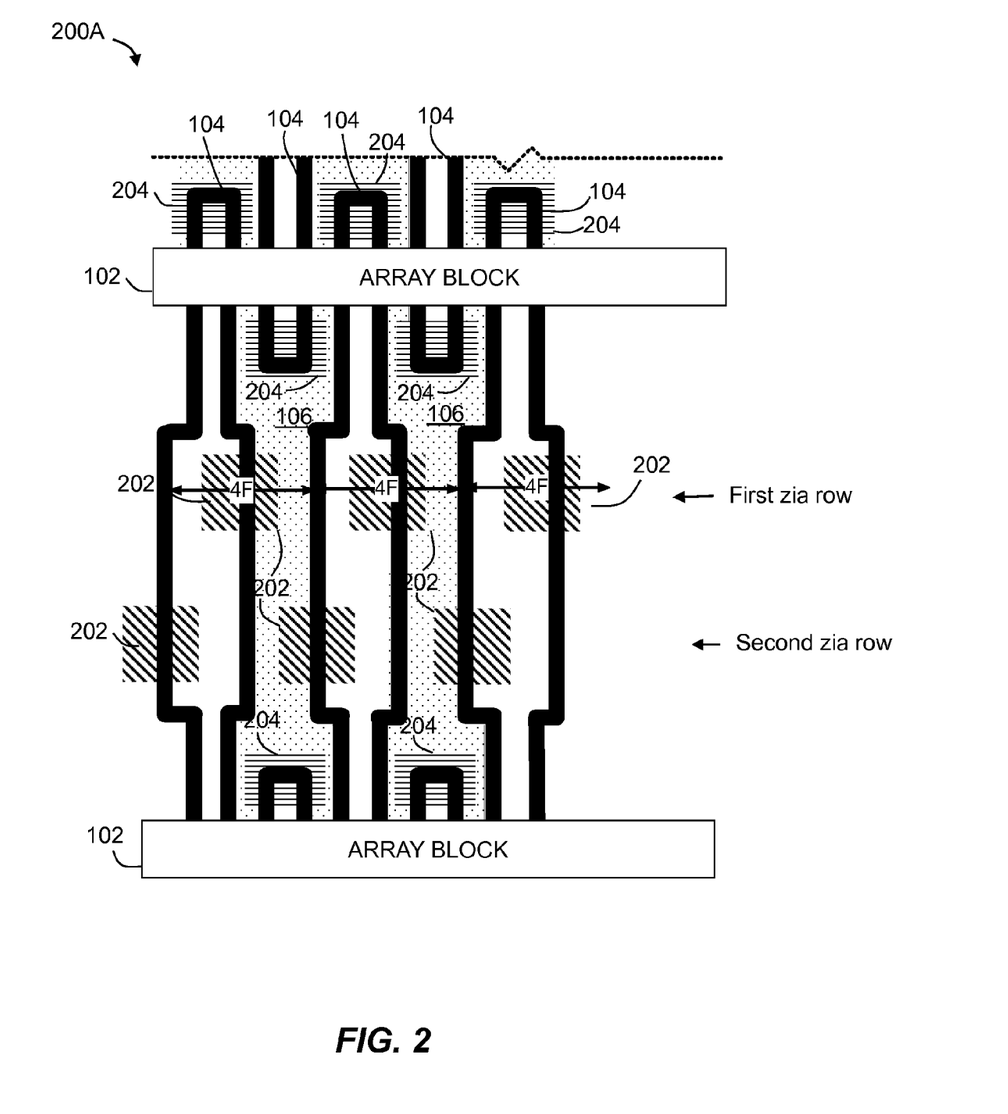
FIG. 2 is a schematic drawing of an example arrangement of a memory line layout including cut shapes and contact pads according to some embodiments of the present invention.

Turning to FIG. 2 for a moment, a feature of the layout of the present invention is that the template shape 106 between the pairs of array lines 104 extends out of the array block 102 beyond the location of the cut mask shape 204 (FIG. 2) or end of the terminated pair. The cut mask 204 may terminate the adjacent pair and separate the adjacent pair into individual electrical nodes. This separation is used in any case when sidewall defined lines are used in the array and does not add process complexity for the multiple line pitch relaxing technique. The cut mask 204 may have four times the pitch compared to the array lines 104. The group of array lines extending into the contact area may be separated at the far side of the array 102 by a cut mask shape 204. The array lines 104 that extend into the contact area may extend into a second array block 102 and may be shared between the two arrays. Cut masks 204 at the far side of both arrays 102 are used to separate the pair 104 into unique electrical nodes.

Past the cut mask 204 in the contact area, the width of template shapes 106 is increased significantly because half the array lines have been cut. In FIG. 1, "2F" indicates the increased width for example. The spacing between template shapes 106 may also be increased to a width greater than the feature size of the lithography. The array lines 104 which are formed at the edge of the template shape 106 therefore have a pitch greater than the lithography feature size as indicated in FIG. 1 by the "2F" dimension where "F" represents the pitch of the array lines 104 as shown in FIG. 1. The F dimension also represents the half pitch of lithography tools used for forming the template shape 106. Since zias 202 for each of the two lines 104 of the pair are staggered, the zia pitch is 4F as shown in FIG. 2. First and second zia rows are indicated in FIG. 2.

In some embodiments, the memory lines may be approximately 32 nm down to approximately 4 nm wide and spaced apart a distance approximately 32 nm down to approximately 4 nm at the point the lines 104 exit the array blocks 102. The pairs of lines 104 are formed on either side of a template mask 106. To achieve approximately equal line and space for the array lines, the template shape 106 may be reduced in size during the photolithography and etching processes so that the template width is less than the template space in the array areas. The template shape 106 may be reduced in size down from 32 nm to approximately 4 nm in the tight pitch regions. As shown in FIG. 1, the array line pairs 104 can extend into adjacent array blocks 102, as may be desirable in a three-dimensional matrix memory chip. The line pairs 104 are disconnected from each other at the far edge of the array block into separate lines using a cut mask which is described below with respect to FIG. 2. In some embodiments, the template mask 106 is two times (2×) the half pitch (HP) relative to the fabricated memory lines. In some alternative embodiments, where double sidewall patterning is used, the template mask may be four times (4×) HP.

In operation, array lines are electrically driven for write operations and sensed for read operations by connection to a data bus (not shown) controlled by array line driver circuitry under the contact region 105. Adjacent array lines 104 are connected to different data bus lines each of which can be at either an active or inactive state by means of read-write control logic connected to the data bus. Because the lines 104 may be so close together according to the present invention, if adjacent lines are active at the same time, there may be electrical crosstalk that interferes with operation of the memory array 102. Thus, in a further aspect of the invention, at any given time, only one group of alternating lines 104A or 104B may be active while the other lines are inactive. In other words, when lines 104A carry a signal, lines 104B are not used and when lines 104B carry a signal, lines 104A are not used. This insures that no two adjacent lines 104A and 104B are active at the same time and provides sufficient spacing between lines to avoid crosstalk or other interference effects. In some embodiments, only every third, or fourth, or fifth array line may be active at a given time. In other embodiments, any pattern of lines may be used that avoids interference between lines.

Turning again to FIG. 2, the locations of zia contact pads 202 and the cut mask 204 areas are indicated with cross-hatching and horizontal lines respectively. Zias provide means to connect memory lines (or more generally conductors) on multiple different memory layers to array line drivers and other support circuitry. Whereas a conventional via connects two different layers of a circuit, a zia connects multiple layers. Note that as shown in FIG. 2, each memory line 104 passes through one of the staggered zia contact pads 202 to connect two adjacent array blocks 102. By staggering the zia contact pads 202 in an alternating or checker board pattern and routing the memory lines 104 as shown, there is more room for the zia contact pads 202 even thought the memory line pitch is relatively small.

The cut mask 204, as indicated above, is used to separate the pairs of memory lines 104 formed using the template mask 106 into two separate conductors. The cut mask 204 indicates a portion of the memory lines 104 that will be removed. In the example embodiment shown, the cut mask 204 is 4×HP and arranged at a pitch as large as 4 times the pitch of the array lines. In other words, the layout of the present invention allows the cut mask 204 areas to be four times larger than the distance between the memory lines. This means that the cut mask 204 can be manufactured with substantially lower precision requirements (e.g., with looser tolerances) and therefore less expensively, than would otherwise be possible without the present invention. Likewise, by staggering the zia contact pads 202, the zia contact pads 202 can be made larger to allow a larger margin (e.g., more tolerance) for misalignment between the zias and the memory lines, which also reduces costs associated with having to use much more precise and expensive manufacturing tools.

Figure 3:
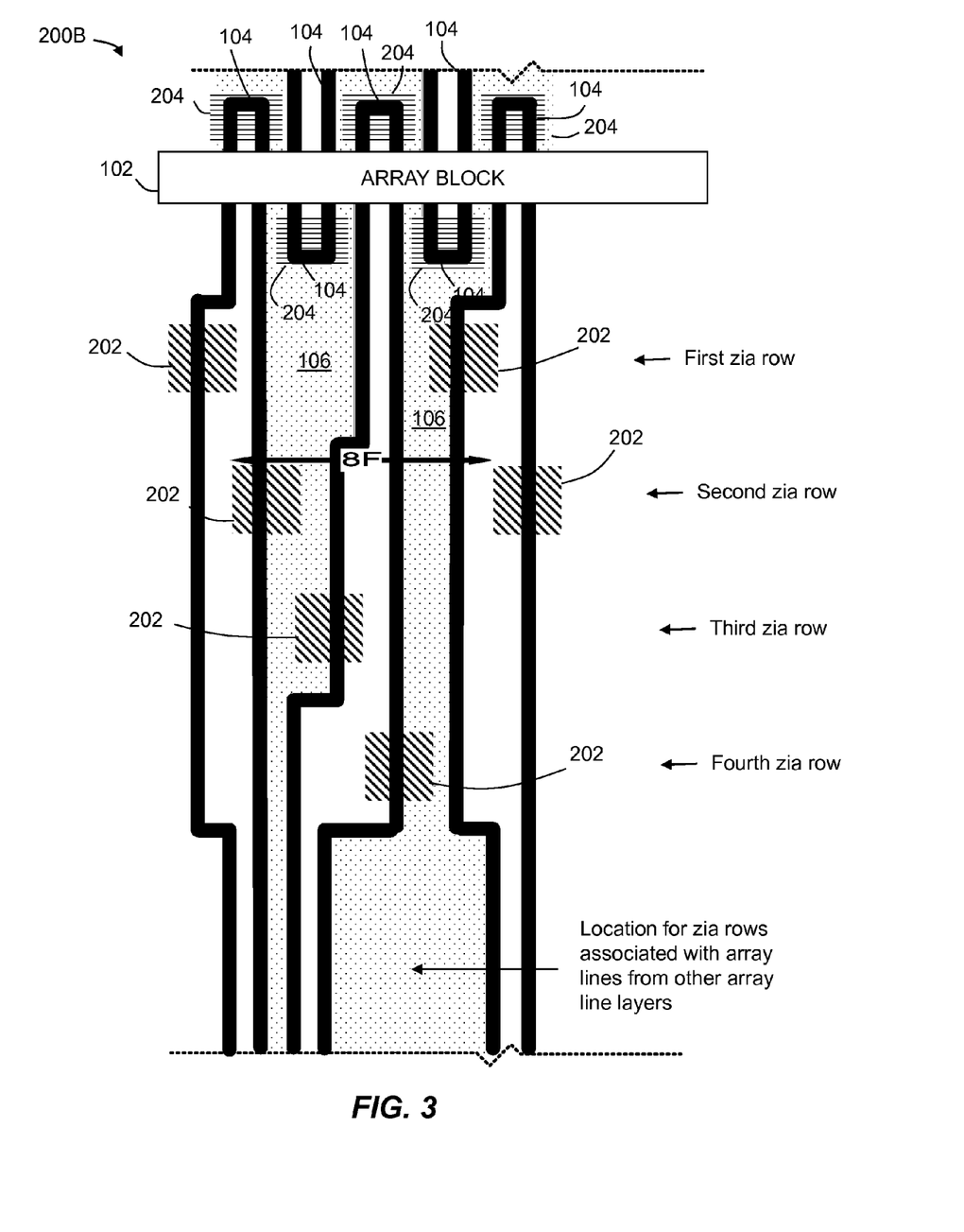
FIG. 3 is a schematic drawing of an example alternative arrangement of a memory line layout according to some embodiments of the present invention.

Turning to FIG. 3, an alternative example embodiment of the memory line layout 200B of the present invention is shown. In the embodiment depicted in FIG. 3, the zia contact pads 202 are staggered in four rows and may be at a pitch eight times larger than the array pitch as illustrated by the symbol 8F. The zias are arranged in a graduated or stair step pattern. In yet other embodiments, any practicable combination of the alternating pattern of FIG. 2 and the graduated pattern of FIG. 3 may be employed to achieve the desired zia pitch. In still yet other embodiments, any arrangement where the desired 4×HP or greater spacing is achieved may be employed.

As compared to the embodiment of FIG. 2, further relaxation of zia pitch may be achieved in the embodiment of FIG.

3. Half of the pairs of array lines 104 that extend into the contact region extend at the substantially unchanged spacing of the array lines 104 past the first two rows of zias 202 and are contacted in a third and fourth row of zias 202. The zias 202 are staggered in four rows and have a pitch of 8F. The location of zias 202 may be staggered in more than four rows if desired to increase zia pitch further.

Figure 4:
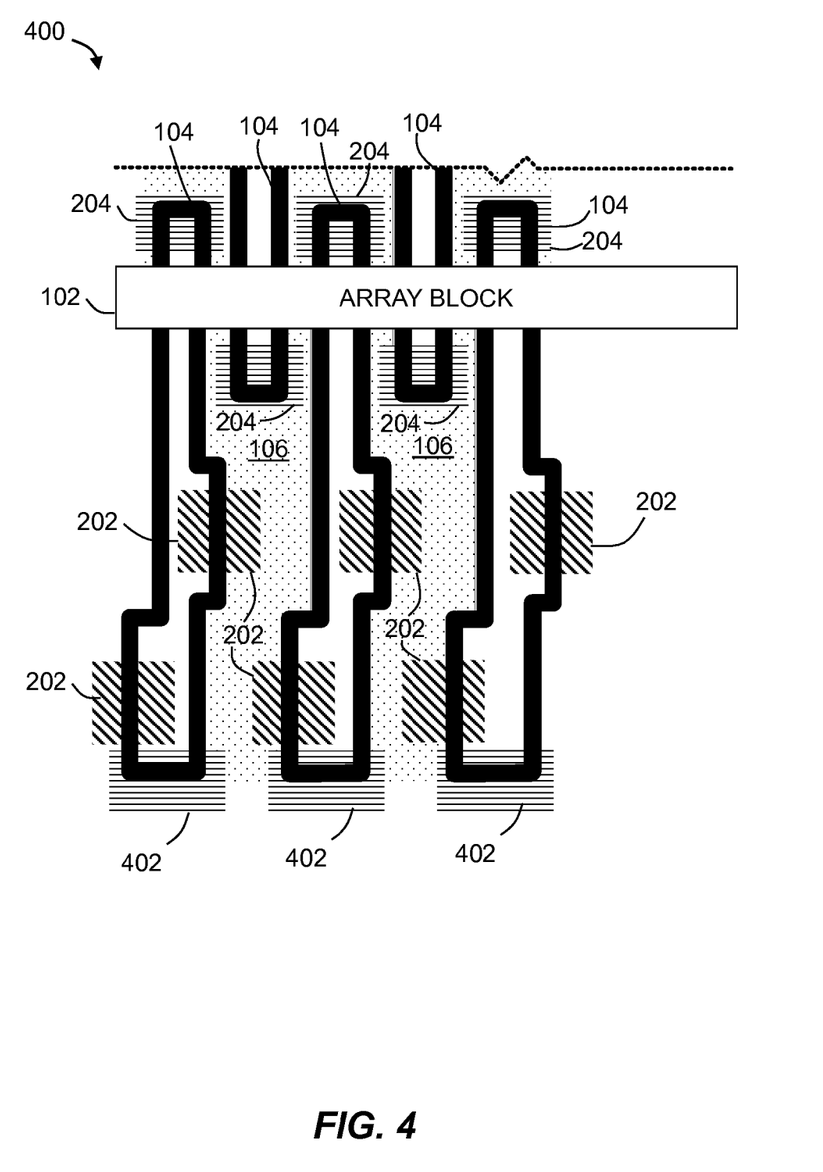
FIG. 4 is a schematic drawing of an example additional alternative arrangement of a memory line layout according to some embodiments of the present invention.

FIG. 4 depicts additional cut shapes 402 that can be used with the cut mask 204. These cut shapes maybe larger than or equal to the 4×HP size of the other shapes in the cut mask 204. These larger cut shapes 402 may be used for fill shapes, or to terminate the memory lines 104 that extend beyond the last memory array block 102.

FIGS. 5A to 5D are schematic drawings of example arrangements of memory lines of different wiring layers intersecting at via or zia contact pads 202. The contact pads are represented by the diagonal cross-hatched area. The vertical cross-hatched area represents a top conductive layer in which line 104 is formed. The solid black area depicts a memory line 502 formed in a next lower layer. The two lines 104, 502 can overlap each other to some degree however, there is not complete overlap due to the use of different shapes. Formation of both the lines may be done using a sidewall defined process, for example, that uses an $SiO_2$ template layer, a polysilicon sidewall hard mask, a TiN adhesion layer, and a tungsten (W) wiring layer.

Figure 5A:
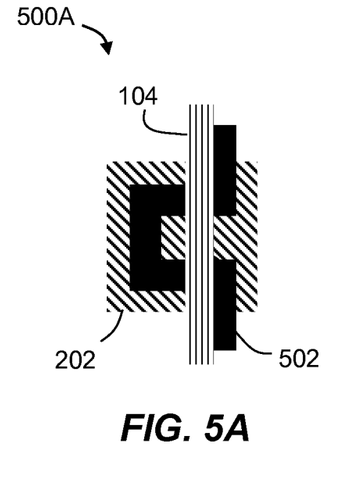
FIGS. 5A to 5D are schematic drawings of example arrangements of memory lines of different wiring layers intersecting at contact pads/vias according to some embodiments of the present invention.
Figure 5B:
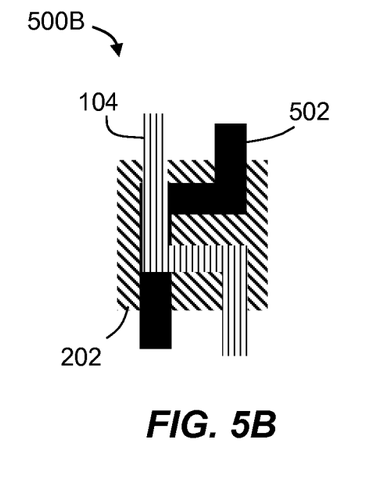
Figure 5C:
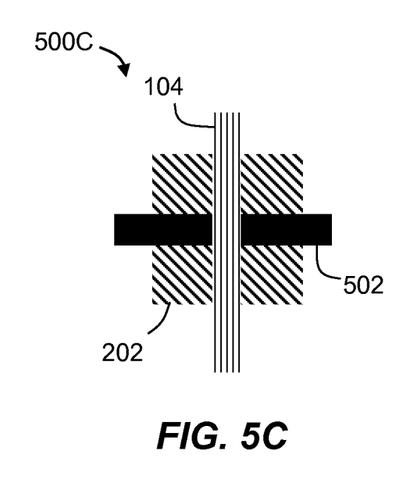
Figure 5D:
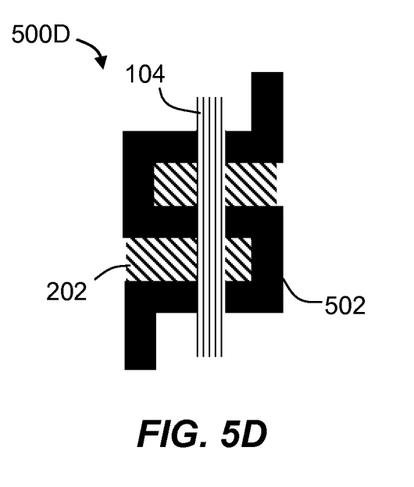

Four example intersecting line pairs are shown in FIGS. 5A to 5D. In FIG. 5A, a straight line 104 is shown intersecting a box or "C" shaped line 502. In FIG. 5B, two stepped lines 104, 502 are shown intersecting and in FIG. 5C, two straight lines 104, 502 are shown intersecting. FIG. 5D depicts a straight line 104 intersecting a serpentine shaped line 502. The arrangement shown in FIG. 5D may result in the maximum contact area between the intersecting lines. Other shapes and/or combinations are possible. The present invention may use any combination of shaped intersecting lines that is practicable.

Figure 6:
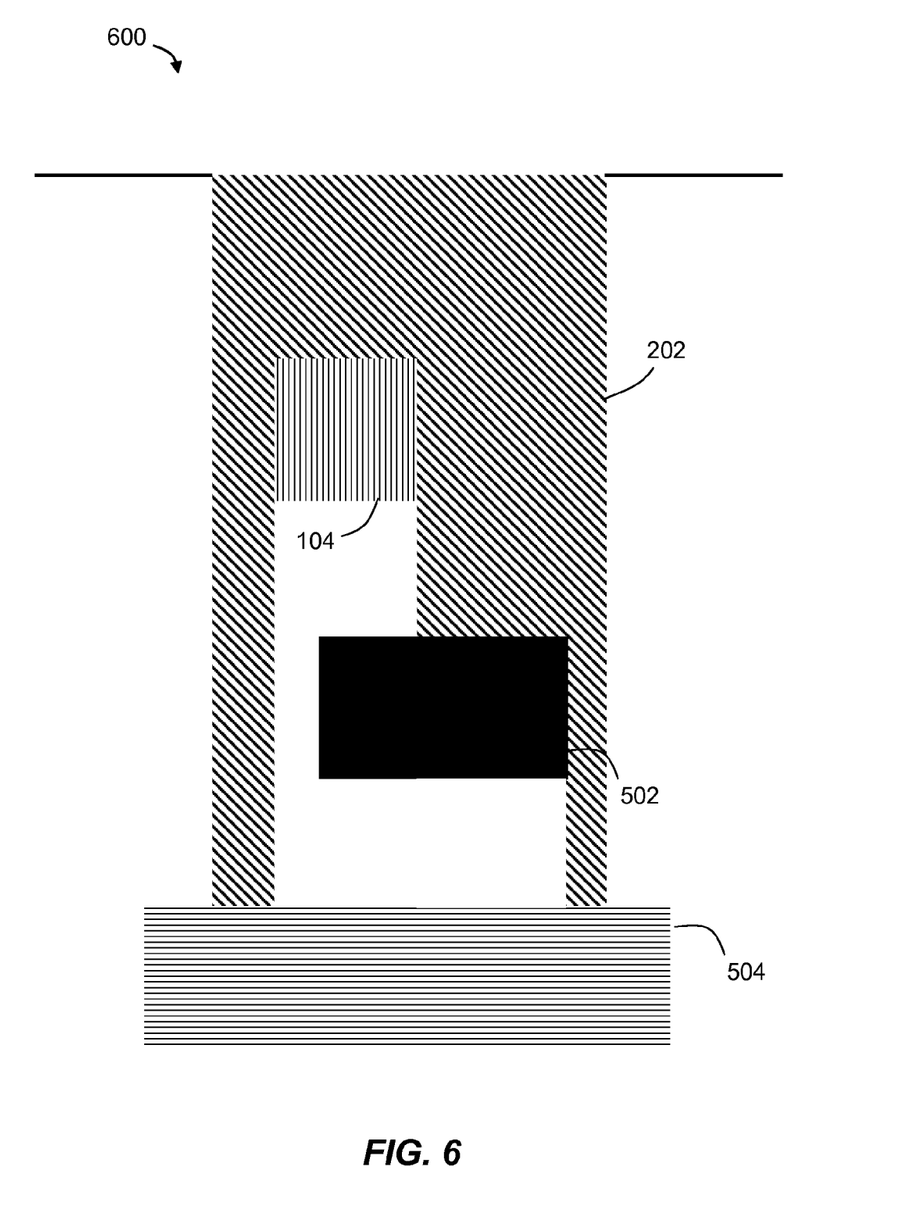
FIG. 6 is a side cross-sectional view of a contact pad/via with intersecting wiring layers according to some embodiments of the present invention.

Turning to FIG. 6, a side cross-sectional view of a zia 202 and two intersecting conductive lines 104, 502 are shown. The zia 202 contacts the conductive lines 104, 502 to form the electrical connection between the two lines 104, 502. When the zia is formed, the etch is controlled so that the zia is borderless to the lines 104, 502. No border of the array lines beyond the zia is required because the etch of a feature or hole in an insulating material, such as $SiO_2$, into which the zia material (e.g., such as tungsten) is filled, is controlled to reach down to only desired conductors such as array line 502 or a control node 504. Control node 504, being the lowest conductor contacted by the zia, may have a border to the zia, i.e., be formed larger than the zia 202. As mentioned above, the lines may be formed using a sidewall defined process, for example, that uses an $SiO_2$ template layer, a polysilicon sidewall hard mask, a TiN adhesion layer, and a W wiring layer.

Figure 7:
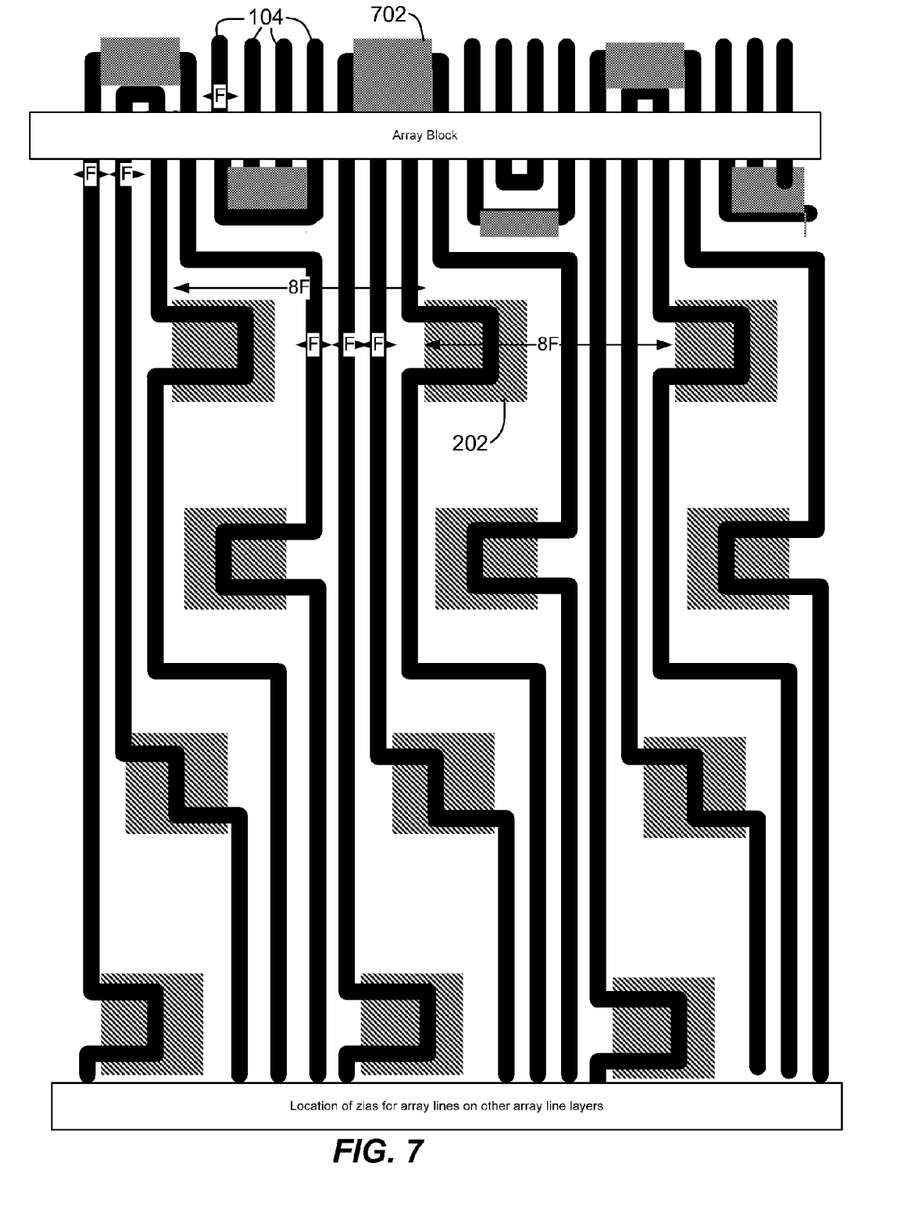
FIG. 7 is a schematic drawing of an example arrangement of a memory line layout including cut shapes and contact pads according to some embodiments of the present invention.

In another embodiment, pitch relaxation is achieved for the array lines by terminating groups of four memory lines 104 by a cut mask 702 as shown in FIG. 7. Grouping by four lines increases the pitch of the cut mask 702 which allows the use of less expensive lithography tools for the cut mask 702. The zias 202 are disposed in four rows and have a pitch of 8F as shown. The location of zias 202 may be disposed in more than four rows if desired to increase zia pitch further. In some embodiments, groups of three or more than four lines can also be used. In other embodiments, (1) the grouping by four or more array lines, (2) staggering zias in more rows, and (3) extending every fourth group of array line shapes without increased spacing beyond some zia rows, can all be combined.

Persons of ordinary skill in the art will understand that alternative memory cells in accordance with this invention may be fabricated using other similar techniques.

The foregoing description discloses only exemplary embodiments of the invention. Modifications of the above disclosed apparatus and methods which fall within the scope of the invention will be readily apparent to those of ordinary skill in the art. For example both bit lines and word lines which are substantially perpendicular sets of array lines may use the pitch and area relaxation of the present invention. Bit lines and array lines may be formed along different edges of the array blocks. Array lines formed in accordance with the present invention may be shared by two layers of 3D memory cells. In some embodiments array lines from additional 3D memory cell layers, for example those used as bit lines, may have additional zia rows beyond those zia rows shown in FIGS. 2, 3, 4, and 7. Further, array lines on one layer may pass by and not electrically contact zias associated with array lines on a second layer. Such non-contacted array lines may preferably pass by zias at a small feature size substantially the same as the array HP and may use the embodiment of FIG. 3 and zias with a pitch substantially greater than the pitch of the cut mask shape. In other embodiments, for example when the array lines are used as a word line, the zia may contact array lines on multiple layers as shown in FIG. 6.

Accordingly, although the present invention has been disclosed in connection with some specific exemplary embodiments thereof, it should be understood that other embodiments may fall within the spirit and scope of the invention, as defined by the following claims.

The invention claimed is:

1. A memory line layout method comprising:
    forming a plurality of memory lines extending from one or more memory array blocks wherein the memory lines have a half pitch dimension smaller than the nominal minimum feature size capability of a lithography tool used in forming the memory lines; and
    forming a plurality of zia contact areas having a dimension larger than the nominal minimum feature size capability of the lithography tool,
    wherein the memory lines are arranged in a pattern adapted to allow a single memory line to intersect a single zia contact area and to provide area between other memory lines for other zia contact areas.

2. The memory line layout method of claim 1, wherein the memory lines are formed via a sidewall defined process.

3. The memory line layout method of claim 1, wherein the memory lines extend in interleaved pairs from opposite sides of the memory array blocks.

4. The memory line layout method of claim 3, wherein a cut shape having a dimension larger than the nominal minimum feature size capability of the lithography tool is positioned on each of a subset of pairs of memory lines.

5. The memory line layout method of claim 4, wherein the cut shape includes a dimension that is four times the half pitch of the memory lines.

6. The memory line layout method of claim 1, wherein the pattern of the memory lines is a staggered pattern.

7. The memory line layout method of claim 1, wherein the pattern of the memory lines is a stepped pattern.

8. The memory line layout method of claim 1, wherein the pattern of the memory lines is a combination of a staggered and stepped pattern.

9. The memory line layout method of claim 1, wherein the zia contact areas include a dimension that is four times the half pitch of the memory lines.

10. A three-dimensional memory comprising:
a plurality of memory layers coupled together by a plurality of zias, each zia including a zia contact area on at least one memory layer,
wherein each memory layer includes one or more memory array blocks coupled to memory lines,
wherein the memory lines extend from the memory array blocks,
wherein the memory lines have a half pitch dimension smaller than the nominal minimum feature size capability of a lithography tool used in forming the memory lines,
wherein the zia contact areas have a dimension larger than the nominal minimum feature size capability of the lithography tool, and
wherein the memory lines are arranged in a pattern adapted to allow a single memory line to intersect a single zia contact area and to provide area between other memory lines for other zia contact areas.

11. The three-dimensional memory of claim 10, wherein the memory lines are formed via a sidewall defined process.

12. The three-dimensional memory of claim 10, wherein the memory lines extend in interleaved pairs from opposite sides of the memory array blocks.

13. The three-dimensional memory of claim 12, wherein a cut shape having a dimension larger than the nominal minimum feature size capability of the lithography tool is positioned on each of a subset of pairs of memory lines.

14. The three-dimensional memory of claim 13, wherein the cut shape includes a dimension that is four times the half pitch of the memory lines.

15. The three-dimensional memory of claim 10, wherein the pattern of the memory lines is a staggered pattern.

16. The three-dimensional memory of claim 10, wherein the pattern of the memory lines is a stepped pattern.

17. The three-dimensional memory of claim 10, wherein the pattern of the memory lines is a combination of a staggered and stepped pattern.

18. The three-dimensional memory of claim 10, wherein the zia contact areas include a dimension that is four times the half pitch of the memory lines.

19. A memory layer for a three-dimensional memory, the memory layer comprising:
one or more memory array blocks;
a plurality of memory lines coupled to the memory array blocks; and
a plurality of zia contact areas for coupling the memory layer to other memory layers in a three-dimensional memory,
wherein the memory lines extend from the memory array blocks,
wherein the memory lines have a half pitch dimension smaller than the nominal minimum feature size capability of a lithography tool used in forming the memory lines,
wherein the zia contact areas have a dimension larger than the nominal minimum feature size capability of the lithography tool, and
wherein the memory lines are arranged in a pattern adapted to allow a single memory line to intersect a single zia contact area and to provide area between other memory lines for other zia contact areas.

20. The memory layer of claim 19, wherein the memory lines are formed via a sidewall defined process.

21. The memory layer of claim 19, wherein the memory lines extend in interleaved pairs from opposite sides of the memory array blocks.

22. The memory layer of claim 21, wherein a cut shape having a dimension larger than the nominal minimum feature size capability of the lithography tool is positioned on each of a subset of pairs of memory lines.

23. The memory layer of claim 22, wherein the cut shape includes a dimension that is four times the half pitch of the memory lines.

24. The memory layer of claim 19, wherein the pattern of the memory lines is a staggered pattern.

25. The memory layer of claim 19, wherein the pattern of the memory lines is a stepped pattern.

26. The memory layer of claim 19, wherein the pattern of the memory lines is a combination of a staggered and stepped pattern.

27. The memory layer of claim 19, wherein the zia contact areas include a dimension that is four times the half pitch of the memory lines.

28. A memory layer for a three-dimensional memory, the memory layer comprising:
a plurality of memory array blocks;
a plurality of memory lines coupled to the memory array blocks; and
a plurality of zia contact areas for coupling the memory layer to other memory layers in a three-dimensional memory,
wherein the memory lines extend from the memory array blocks and are formed using a sidewall defined process,
wherein the memory lines have a half pitch dimension smaller than the nominal minimum feature size capability of a lithography tool used in forming the memory lines,
wherein the zia contact areas have a dimension that is approximately four times the half pitch dimension of the memory lines, and
wherein the memory lines are arranged in a pattern adapted to allow a single memory line to intersect a single zia contact area and to provide area between other memory lines for other zia contact areas.

* * * * *